(12) United States Patent
Gunther et al.

(10) Patent No.: US 7,759,754 B2
(45) Date of Patent: Jul. 20, 2010

(54) ECONOMICAL MINIATURIZED ASSEMBLY AND CONNECTION TECHNOLOGY FOR LEDS AND OTHER OPTOELECTRONIC MODULES

(75) Inventors: Ewald Gunther, Deutschland (DE); Jorg-Erich Sorg, Regensburg (DE); Karl Weidner, Deutschland (DE); Jorg Zapf, Munich (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 813 days.

(21) Appl. No.: 10/579,542

(22) PCT Filed: Oct. 27, 2004

(86) PCT No.: PCT/EP2004/052676

§ 371 (c)(1),
(2), (4) Date: Feb. 28, 2007

(87) PCT Pub. No.: WO2005/050746

PCT Pub. Date: Jun. 2, 2005

(65) Prior Publication Data

US 2007/0190290 A1    Aug. 16, 2007

(30) Foreign Application Priority Data

Nov. 17, 2003   (DE) ................ 103 53 679

(51) Int. Cl.
*H01L 31/113* (2006.01)
(52) U.S. Cl. ............... 257/434; 257/E31.118; 257/98; 257/100; 257/431; 428/138
(58) Field of Classification Search ......... 257/E31.117, 257/E33.068, 98–100, 431–434, 680, E31.118, 257/E31.13; 428/138
See application file for complete search history.

(56) References Cited

U.S. PATENT DOCUMENTS

| | | |
|---|---|---|
| 4,005,457 A | 1/1977 | Hill et al. |
| 4,936,808 A | 6/1990 | Lee |
| 5,307,360 A | 4/1994 | Roustin |
| 5,670,797 A * | 9/1997 | Okazaki ............... 257/91 |
| 6,130,465 A * | 10/2000 | Cole ................ 257/431 |
| 6,184,544 B1 | 2/2001 | Toda et al. |
| 6,291,841 B1 | 9/2001 | Wu |
| 6,335,545 B1 | 1/2002 | Toda et al. |
| 6,373,188 B1 | 4/2002 | Johnson et al. |
| 6,404,792 B1 * | 6/2002 | Yamamoto et al. ..... 372/46.01 |
| 6,412,971 B1 | 7/2002 | Wojnarowski et al. |
| 6,479,930 B1 * | 11/2002 | Tanabe et al. ........... 313/509 |
| 6,754,950 B2 * | 6/2004 | Furukawa et al. ......... 29/832 |
| 6,932,516 B2 * | 8/2005 | Ouchi et al. ............. 385/88 |
| 7,126,163 B2 * | 10/2006 | Katoh .................. 257/99 |
| 7,183,589 B2 * | 2/2007 | Kameyama et al. ....... 257/100 |
| 7,335,951 B2 * | 2/2008 | Nishi et al. ............ 257/350 |

(Continued)

FOREIGN PATENT DOCUMENTS

DE    39 23 633 A1    6/1990

(Continued)

*Primary Examiner*—Chris C Chu
(74) *Attorney, Agent, or Firm*—Dickstein Shapiro LLP

(57) ABSTRACT

An economical miniaturized assembly and connection technology for LEDs and other optoelectronic modules is provided. A manufactured item in accordance with this technology includes a substrate with an optoelectronic component contacted in a planar manner.

19 Claims, 2 Drawing Sheets

U.S. PATENT DOCUMENTS

| | | | |
|---|---|---|---|
| 7,420,218 B2 * | 9/2008 | Nagai | 257/98 |
| 7,560,741 B2 * | 7/2009 | Harle et al. | 257/98 |
| 7,615,794 B2 * | 11/2009 | Katsuno et al. | 257/93 |
| 7,622,743 B2 * | 11/2009 | Nagai et al. | 257/81 |
| 2002/0096254 A1 | 7/2002 | Kober et al. | |
| 2002/0137245 A1 | 9/2002 | Kitamura et al. | |
| 2003/0160258 A1 | 8/2003 | Oohata | |
| 2004/0005728 A1 | 1/2004 | Sugahara et al. | |
| 2004/0041159 A1 | 3/2004 | Yuri et al. | |

FOREIGN PATENT DOCUMENTS

| | | |
|---|---|---|
| DE | 4228274 | 3/1994 |
| DE | 199 01 918 A1 | 7/1999 |
| DE | 199 91 918 | 7/1999 |
| EP | 1 398 839 | 3/2004 |
| JP | 55 0700 80 | 5/1980 |
| JP | 58-130375 | 8/1983 |
| JP | 11 087779 | 3/1999 |
| JP | 2001 044498 | 2/2001 |
| JP | 2003-218392 | 7/2003 |
| WO | WO-02/089221 | 11/2002 |
| WO | WO-03/063312 | 7/2003 |
| WO | WO-2004/077578 | 9/2004 |

* cited by examiner

150 µm

ECONOMICAL MINIATURIZED ASSEMBLY AND CONNECTION TECHNOLOGY FOR LEDS AND OTHER OPTOELECTRONIC MODULES

CROSS-REFERENCE TO RELATED APPLICATIONS

This application is a national stage application under 35 U.S.C. Section 371 of International Application No. PCT/EP2004/052676, filed Oct. 27, 2004, which published in German as WO 2005/050746 and which claims benefit of German Patent Application 103 53 679.5, filed Nov. 17, 2003.

BACKGROUND OF THE INVENTION

In the production of individual LEDs and lighting modules (compact light sources) wire bonding and soldering, or mounting chips with conductive glue, are predominantly used as technologies for electrical contact between a chip and a substrate. In this way, insertable components as well as LED arrays for lighting modules are produced. The customary assembly process is as follows:
  die bonding: placing of the chip(s) in a filled conductive glue (gluing) and hardening of the glue or
  mounting of the chip with the aid of a solder under temperature and possibly pressure (soldering/alloying),
  wire bond: electrical connection of the chip by wire contact,
  encapsulation of the chip with transparent material (epoxy, silicone, acrylate, polyurethane, and other polymers) by casting or injection technology,
  producing individual parts by sawing, water-jet cutting, or laser separation.

SUMMARY OF THE INVENTION

In the development of miniaturization, smaller and smaller component heights are being demanded on the market. Along with this, the manufactured items must be economical and offer sufficient reliability. In the case of chip arrays even very high reliability is required. Moreover, the connection technology should offer great flexibility in order to be able to react quickly, flexibly, and economically to design changes.

Proceeding from this, the objective of the invention is to specify modules with a substrate and optoelectronic components, as well as processes for their production, which satisfy these requirements.

This objective is realized by the inventions specified in the independent claims. Advantageous developments follow from the subordinate claims.

Accordingly, a substrate has an optoelectronic component which is contacted thereto in a planar manner. The contacting is therefore no longer accomplished by thick wires, in given cases running at a distance from the substrate and component, but rather by a planar, flat, even conducting structure approximately in the form of a copper layer.

By virtue of contacting in a planar manner, an especially small height of the module consisting of the substrate and optoelectronic component can be achieved.

The optoelectronic component can, for example, be contacted by other optoelectronic components on the substrate. In particular, it is contacted in a planar manner by conducting elements, e.g. printed conductors, of the substrate.

In order to run the planar contact at as small a distance from the substrate and/or optoelectronic component as possible, the substrate and/or the optoelectronic component are provided, at least partially, with an insulating layer on which the planar conducting structure is disposed for planar contacting of the optoelectronic component.

The insulating layer can be formed by a foil, enamel, and/or a polymer layer. The layer can be laminated, vapor deposited, printed, and/or sprayed. Structuring of the insulating layer can be done, for example, by means of laser structuring, (plasma) etching structuring, inkjet structuring, and/or photostructuring. As a polymer, parylene in particular can be used.

In the optoelectronic component an interaction of light with the environment should be possible. This can be realized particularly advantageously in two ways.

In one, the insulating layer as a whole, or in particular an area of the light entry and/or exit opening of the optoelectronic component, can be (highly) transparent.

In the other, a window can be opened in the insulating layer in the area of the light entry and/or exit opening of the optoelectronic component. The window can, e.g. if the insulating layer is formed by a foil, already be present in the layer before its application. Alternatively however, it can also be opened after the application of the layer by corresponding structuring of the layer by means of the aforementioned procedures.

Such a window is preferably provided in the insulating layer also in the area of one or more electrical contact points of the optoelectronic component. The planar conducting structure can be led through the window to the contact point of the optoelectronic component.

If this is planned, the insulating layer and/or the planar conducting structure can also cover, at least partially, a light entry and/or exit opening of the optoelectronic component.

For this, the planar conducting structure is embodied to be reflecting so that, for example, light is reflected back into the optoelectronic component and can leave at another light exit opening. Thus, the planar contact can cause light guidance in addition.

The optoelectronic component is, for example, an LED, in particular an OLED, and/or a photovoltaic component. As substrate a printed circuit board, a ceramic element, a Flex, in particular laminated on both sides with cooper, a punched or etched lead frame, or a layer structure can be used, as, for example, in the production of chip cards or flexible circuits.

Preferably, the height of the manufactured item with a substrate and an optoelectronic component is less than 0.4 mm.

In a process for producing a manufactured item comprising a substrate with an optoelectronic component the optoelectronic component is contacted in a planar manner. Advantageous developments of the process follow analogously to the advantageous developments of the manufactured item and vice versa.

BRIEF DESCRIPTION OF THE DRAWINGS

Further advantages and features of the invention can be inferred from the description of embodiment examples with the aid of the drawings. Therein

DESCRIPTION OF THE PREFERRED EMBODIMENTS

First, several characteristics of assembly and connection technology will be presented.

One or more optoelectronic components, e.g. in the form of chips, are fixed on a substrate by gluing or soldering. The electrical connection of contact points in the form of contact pads on the upper side of the optoelectronic components is then achieved through a planar contacting process. This can be based, for example, on the lamination of an electrically insulating foil and contacting by planar conducting structures in the form of metal structures on this foil. Instead of being in the form of an insulated foil, an insulated layer can also be produced by other processes, such as enameling, vapor deposition, or printing.

For the insulating layer in the form of insulating foil:
  Application, for example, through isostatic lamination in an autoclave, through the use of a hot roll laminator, or in a vacuum hot press.
  The foil can be transparent in the wave length range of the light emitted from or absorbed by the optoelectronic component. Then, no partial removal of the foil is necessary. The foil can then also take over the protective function of the clear mold compound.
  If the foil is not sufficiently transparent, it can be structured so that the light exit on the chip flanks and/or on the upper side of the chip is maximized according to LED type. This can be done, for example, flexibly and independent of the topography by means of laser ablation.
  By suitable laminating processes the insulating foil can be made to reproduce the chip surface. With this, it can be achieved that there is fill insulating function to increase reliability even at the edges and in the corner areas.

For contacting by planar conducting structures in the form of metal structures there are various possibilities:
  Electrical connection by a suitable metallization process, e.g. application of a thin starting layer by means of sputtering or vapor deposition, followed by selective reinforcement with currentless or galvanic deposition, e.g. by copper.
  The insulating foil is coated in an electrically conductive manner, e.g. by lamination of a metal foil. This metal foil is then structured before or after the lamination process. The connection between chip and metal structure can be done with raised, in particular rough, bumps on the chip pads by mechanical pressing or also by partial galvanic or currentless deposition. In this case, finishing of the aluminum chip pad on the wafer plane is advantageous.
  The connection can also be made by the use of preformed pressing tools in commercially available presses.
  The conductive metal structures can be applied by a printing process.

Figure 1:
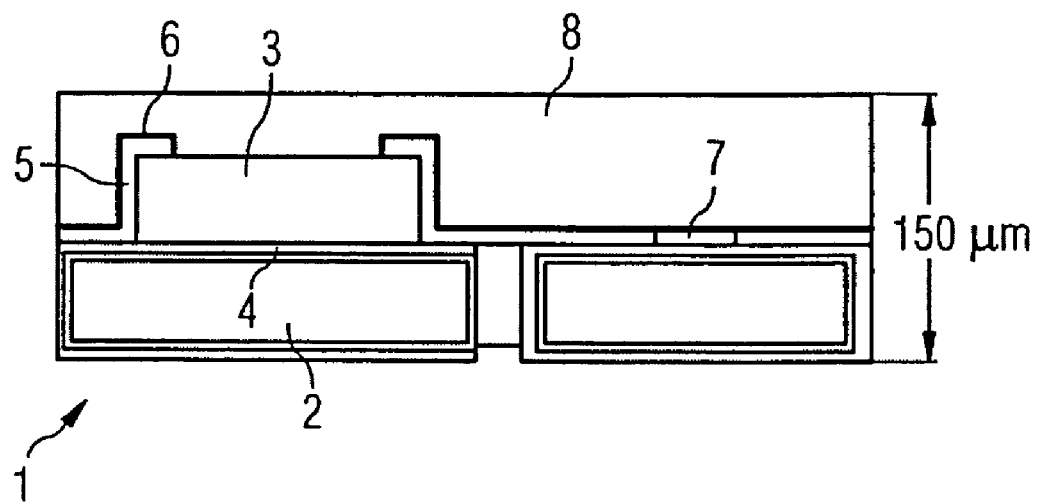
FIG. 1 shows a section through a manufactured item comprising a substrate with an optoelectronic component contacted in a planar manner.

FIG. 1 shows a manufactured item 1 comprising a substrate 2 in the form of an etched copper lead frame. Therein the copper of the lead frame is encircled with a nickel-gold plating in order to improve its soldering properties. On the substrate 2 an optoelectronic component 3 is disposed in the form of a chip and electrically and mechanically connected to the substrate 2 by the conductive glue or solder 4.

An insulating layer 5 in the form of a foil is led over the substrate 2 and the optoelectronic component 3. The insulating layer 5 is opened by a window in the area of the light exit opening of the optoelectronic component 3. To contact the optoelectronic component 3, a planar conducting structure 6 in the form of a metallization is led over the insulating layer 5 to contact points of the optoelectronic component 3 and to a printed conductor 7 of the substrate 2.

The substrate 2 with the optoelectronic component 3, the insulating layer 5, and the planar conducting structure 6 are molded into a protective mass 8 in the form of a clear mold compound. The manufactured item 1 is approximately 150 µm high.

Figure 2:
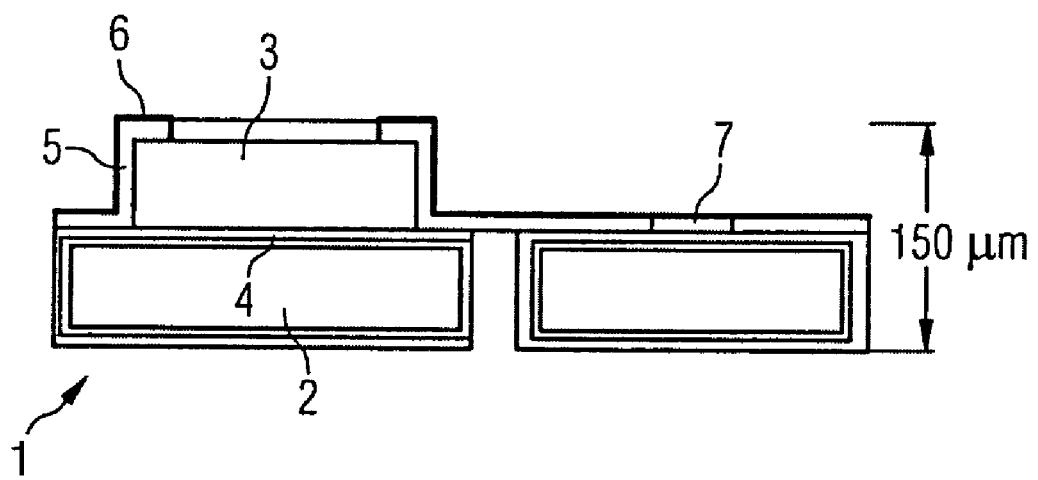
FIG. 2 shows a section through an alternative manufactured item comprising a substrate with an optoelectronic component contacted in a planar manner.

The manufactured item 1 represented in FIG. 2 corresponds to that in FIG. 1 except that the insulating layer 5 is embodied so as to be transparent and thus runs through in the area of the light exit opening of the optoelectronic component 3. Therefore, no window is open there but rather only at the contact points of the optoelectronic component 3 where it is electrically connected to the planar conducting structure 6. The transparent insulating layer 5 can, in particular in the area of the light exit opening of the optoelectronic component 3, contain pigments in order to color the exiting light.

Figure 3:
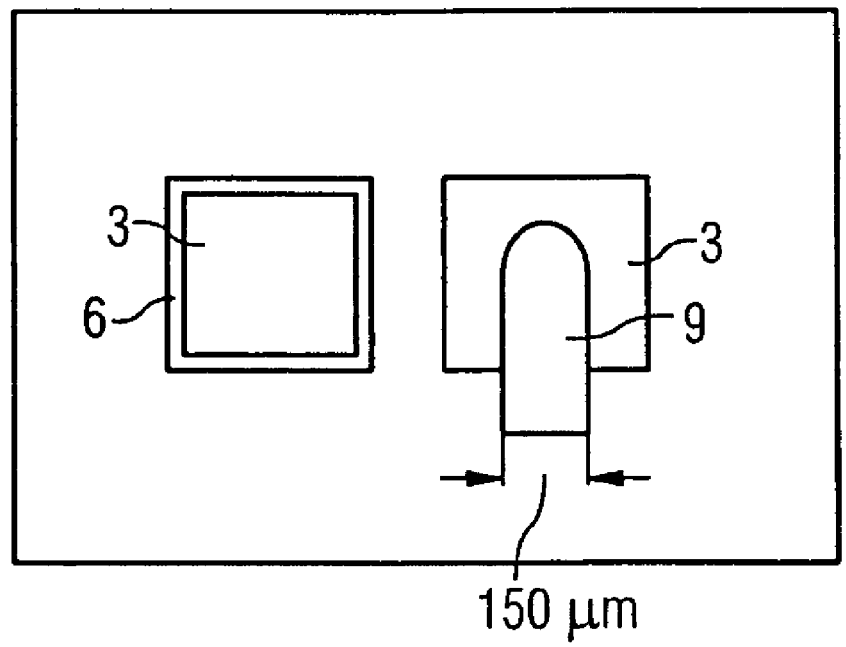
FIG. 3 shows a comparison between an optoelectronic component contacted in a planar manner and in a traditional manner in plan view.

FIG. 3 shows, at the left of he figure, an optoelectronic component 3 contacted in a planar manner with a large central light exit and an edge contact which completely encircles this light exit and comprises a planar conducting structure 6 and an insulating layer concealed thereunder. Alternatively, the edge contact can, depending on the layout of the contact points of the optoelectronic component 3 and intended light guidance, also not be completely encircling but rather only run at one or more individual points to a side of the optoelectronic component 3, specifically the face side opposite the substrate 2.

FIG. 3 shows, at the right of the figure, an optoelectronic component 3 which is contacted according to the state of the art by 120-µm wire bonding with a wire 9. As can be seen, a large part of the light exit opening of the optoelectronic component 3 is covered.

Figure 4:
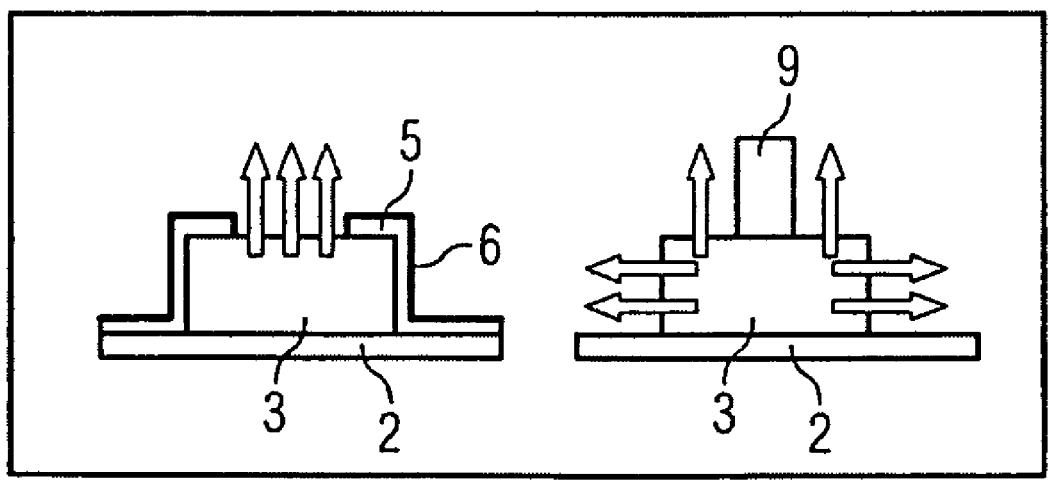
FIG. 4 shows a comparison between the optoelectronic component contacted in a planar manner and in a traditional manner in relation to the loss of light.

The advantages of the planar contact in light guidance become particularly clear in FIG. 4. There one once again sees at the left and on the substrate 2 the optoelectronic component 3 contacted in a planar manner by the insulating layer 5 and the planar conducting structure 6. All the light exit openings of the optoelectronic component 3 where a light exit is not desired are covered by the insulating foil 5 and the planar conducting structure 6. If they are embodied so as to be reflecting, then the light is even reflected back into the optoelectronic component 3 until it exits at the light exit opening provided.

In contradistinction to this, in the case of contacting according to the state of the art and represented at the right in FIG. 4 a large part of the desired light exit area is covered by the connected wire 9. Rather than there, the light exits in an undesired manner parallel to the substrate 2 from the sides of the optoelectronic component 3.

In the case of the optoelectronic component 3 contacted in a planar manner on the contrary, the light exits as desired at a face of the optoelectronic component 3, specifically the front face opposite the substrate 2, and along with this approximately perpendicular to the substrate 2.

The described assembly and connection technology comprises the following steps:
  Small-surface contacting and a variable layout make possible the largest possible light yields.
  Homogenous current distribution by selected contact conductor dimensions with a high light yield as a consequence.
  Ultra-thin, miniaturized structure.
  Planar contacting makes possible thin mold mass covering.

Planar contacting makes possible an effective dissipation of heat by a cooling element mounted in a flat manner.

Economical assembly and connection technology by highly parallel processing (processing in use). Manufacture in the reel-to-reel process is also possible.

No shadowing by central wire bond pads in the center of the chip.

High reliability by adapted material properties, e.g. CTE (coefficient of thermal expansion), Tg (glass transition temperature), and so on.

With suitable choice of the optical properties of the insulating foil it can assume the protective function of the clear mold compound so that the clear mold compound is no longer necessary.

The luminescent materials for the blue-to-white light conversion can be introduced as pigments into the foil. In this way good control of the color coordination is possible by a precisely specified foil thickness and pigment concentration in the foil.

The invention claimed is:

1. An article of manufacture comprising:
   a substrate having a substrate contact;
   an optoelectronic component having a central light exit and/or entry and an edge contact disposed at lease partially around a periphery of the light exit;
   an insulating layer partially arranged on the substrate and the optoelectronic component; and
   a conducting structure arranged on the insulating layer so as to contact the edge contact and the substrate contact, wherein a window is opened in the insulating layer in the area of the central light exit and/or entry of the optoelectronic component.

2. The article of manufacture according to claim 1, wherein the substrate contact is a printed conductor.

3. The article of manufacture according to claim 1, wherein the insulating layer comprises one or more of a foil, enamel, and a polymer layer.

4. The article of manufacture according to claim 1, wherein in the insulating layer in the area of a contact point for the optoelectronic component a window is opened through which the planar conducting structure is led to the contact point of the optoelectronic component.

5. The article of manufacture according to claim 1, wherein the insulating layer contains pigments to color the light emitted from or absorbed by the optoelectronic component.

6. The article of manufacture according to claim 1, wherein the planar contact at least partially covers a light exit and/or entry opening of the optoelectronic component.

7. The article of manufacture according to claim 1, wherein the optoelectronic component comprises one or more of an LED, an OLED, and a photovoltaic component.

8. The article of manufacture according to claim 1, wherein the substrate is one of: a printed circuit board, a Flex, and a lead frame.

9. The article of manufacture according to claim 1, wherein the height of the article of manufacture is less than 0.4 mm.

10. A method of making an article of manufacture according to claim 1, the article of manufacture comprising a substrate and an optoelectronic component, the method comprising contacting the optoelectronic component in a planar manner.

11. The article of manufacture according to claim 1, wherein the conducting structure at least partially covers the light exit and/or entry of the optoelectronic component, the conducting structure being reflective so as to guide light.

12. The article of manufacture according to claim 1, wherein the insulating layer comprises parylene.

13. The article of manufacture according to claim 1, wherein the conducting structure comprises a metal foil being arranged by a lamination process.

14. An article of manufacture comprising:
    a substrate having a substrate contact;
    an optoelectronic component, said optoelectronic component having a central light exit and/or entry and an edge contact disposed at least partially around a periphery of the light exit; and
    a conducting structure, arranged on the optoelectronic component and the substrate so as to contact the edge contact and the substrate contact,
    wherein the conducting structure at least partially covers the light exit and/or entry of the optoelectronic component, the conducting structure being reflective so as to guide light.

15. The article of manufacture according to claim 14, further comprising an electrically insulating layer contacting the optoelectronic component, on which the planar conducting structure is disposed.

16. The article of manufacture according to claim 15, wherein the electrically insulating layer has a window formed in an area of the light exit and/or entry.

17. The article of manufacture according to claim 15, wherein the electrically insulating layer has transparent portion formed in an area of the light exit and/or entry.

18. The article of manufacture according to claim 15, wherein the insulating layer contains pigments for coloring the light emitted or absorbed by the optoelectronic component.

19. The article of manufacture according to claim 14, wherein the conducting structure is a metallic layer.

* * * * *

UNITED STATES PATENT AND TRADEMARK OFFICE
CERTIFICATE OF CORRECTION

PATENT NO. : 7,759,754 B2
APPLICATION NO. : 10/579542
DATED : July 20, 2010
INVENTOR(S) : Ewald Günther et al.

It is certified that error appears in the above-identified patent and that said Letters Patent is hereby corrected as shown below:

In the Title Page

(75)    For the first Inventor listed, please delete "Ewald Gunther, Deutschland (DE)" and insert -- Ewald Günther, Regenstauf (DE) --, therefor.

(75)    For the second Inventor listed, please delete "Jorg-Erich Sorg, Regensburg (DE)" and insert -- Jörg-Erich Sorg, Regensburg (DE) --, therefor.

(75)    For the third Inventor listed, please delete "Karl Weidner, Deutschland (DE)" and insert -- Karl Weidner, München (DE) --, therefor.

(75)    For the fourth Inventor listed, please delete "Jorg Zapf, Munich (DE)" and insert -- Jörg Zapf, München (DE) --, therefor.

Signed and Sealed this
Twenty-eighth Day of December, 2010

David J. Kappos
*Director of the United States Patent and Trademark Office*

UNITED STATES PATENT AND TRADEMARK OFFICE
CERTIFICATE OF CORRECTION

PATENT NO. : 7,759,754 B2  Page 1 of 1
APPLICATION NO. : 10/579542
DATED : July 20, 2010
INVENTOR(S) : Ewald Günther et al.

It is certified that error appears in the above-identified patent and that said Letters Patent is hereby corrected as shown below:

In the Title Page

(75)    For the first Inventor listed, please delete "Ewald Gunther, Deutschland (DE)" and insert -- Ewald Günther, Regenstauf (DE) --, therefor.

(75)    For the second Inventor listed, please delete "Jorg-Erich Sorg, Regensburg (DE)" and insert -- Jörg-Erich Sorg, Regensburg (DE) --, therefor.

(75)    For the third Inventor listed, please delete "Karl Weidner, Deutschland (DE)" and insert -- Karl Weidner, München (DE) --, therefor.

(75)    For the fourth Inventor listed, please delete "Jorg Zapf, Munich (DE)" and insert -- Jörg Zapf, München (DE) --, therefor.

This certificate supersedes the Certificate of Correction issued December 28, 2010.

Signed and Sealed this
Twenty-second Day of February, 2011

David J. Kappos
*Director of the United States Patent and Trademark Office*